United States Patent
Fan et al.

(10) Patent No.: US 11,545,343 B2
(45) Date of Patent: Jan. 3, 2023

(54) ROTARY PLASMA REACTOR

(71) Applicant: Board of Trustees of Michigan State University, East Lansing, MI (US)

(72) Inventors: Qi Hua Fan, Okemos, MI (US); Martin E. Toomajian, Brighton, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 0 days.

(21) Appl. No.: 16/743,091

(22) Filed: Jan. 15, 2020

(65) Prior Publication Data

US 2020/0335311 A1  Oct. 22, 2020

Related U.S. Application Data

(60) Provisional application No. 62/836,831, filed on Apr. 22, 2019.

(51) Int. Cl.
| | | |
|---|---|---|
| *H01J 37/32* | (2006.01) | |
| *C23C 16/44* | (2006.01) | |
| *C23C 16/509* | (2006.01) | |

(52) U.S. Cl.
CPC .... *H01J 37/32458* (2013.01); *C23C 16/4417* (2013.01); *C23C 16/509* (2013.01); *H01J 37/32669* (2013.01); *H01J 2237/18* (2013.01); *H01J 2237/332* (2013.01); *H01J 2237/334* (2013.01)

(58) Field of Classification Search
None
See application file for complete search history.

(56) References Cited

U.S. PATENT DOCUMENTS

| | | |
|---|---|---|
| 4,619,738 A | 10/1986 | Lewis et al. |
| 4,892,633 A | 1/1990 | Welty |
| 4,948,495 A | 8/1990 | Coburn |
| 5,032,202 A | 7/1991 | Tsai et al. |
| 5,246,532 A | 9/1993 | Ishida |
| 5,304,279 A | 4/1994 | Coultas et al. |
| 5,346,579 A | 9/1994 | Cook et al. |

(Continued)

FOREIGN PATENT DOCUMENTS

| | | |
|---|---|---|
| CN | 102056392 A | 5/2011 |
| CN | 102085521 | 6/2011 |

(Continued)

OTHER PUBLICATIONS

Hopwood, J et al., "Langmuir probe measurements of a radio frequency induction plasma", Journal of Vacuum Science & Technology A: Vacuum, Surfaces, and Films. 1993.

(Continued)

*Primary Examiner* — Karla A Moore
(74) *Attorney, Agent, or Firm* — Harness, Dickey & Pierce PLC

(57) ABSTRACT

A rotary plasma reactor system is provided. In another aspect, a plasma reactor is rotatable about a generally horizontal axis within a vacuum chamber. A further aspect employs a plasma reactor, a vacuum chamber, and an elongated electrode internally extending within a central area of the reactor. Yet another aspect employs a plasma reactor for use in activating, etching and/or coating tumbling workpiece material.

31 Claims, 7 Drawing Sheets

(56) References Cited

U.S. PATENT DOCUMENTS

| | | | |
|---|---|---|---|
| 5,415,754 A | 5/1995 | Manley | |
| 5,505,780 A | 4/1996 | Dalvie et al. | |
| 5,534,231 A | 7/1996 | Savas | |
| 5,976,308 A | 11/1999 | Fairbairn et al. | |
| 6,740,212 B2 | 5/2004 | Fan et al. | |
| 7,246,451 B2 | 7/2007 | Victorov et al. | |
| 7,335,847 B2 | 2/2008 | Drewes et al. | |
| 9,496,376 B2 | 11/2016 | Yamazaki et al. | |
| 10,092,890 B2 | 10/2018 | Medoff | |
| 2003/0123992 A1 | 7/2003 | Mitrovic et al. | |
| 2003/0150562 A1 | 8/2003 | Quon | |
| 2004/0250764 A1* | 12/2004 | Nagano | C23C 14/546 423/349 |
| 2005/0202243 A1* | 9/2005 | Bohach | C09C 1/3676 428/402 |
| 2006/0081466 A1 | 4/2006 | Nagashima et al. | |
| 2006/0144304 A1 | 7/2006 | Prigmore et al. | |
| 2007/0095654 A1 | 5/2007 | Gopairaja et al. | |
| 2011/0003088 A1* | 1/2011 | Honda | B01J 2/12 118/723 E |
| 2011/0200822 A1* | 8/2011 | Detavernier | C23C 16/45544 118/704 |
| 2011/0206571 A1 | 8/2011 | Skinner et al. | |
| 2011/0277823 A1 | 11/2011 | Fan et al. | |
| 2012/0145041 A1 | 6/2012 | Walters | |
| 2012/0219728 A1 | 8/2012 | Badri et al. | |
| 2013/0244293 A1 | 9/2013 | Balan et al. | |
| 2013/0307414 A1 | 11/2013 | Choi | |
| 2013/0320274 A1* | 12/2013 | Walters | C01B 32/168 252/511 |
| 2014/0238861 A1 | 8/2014 | Foret | |
| 2014/0313574 A1 | 10/2014 | Bills et al. | |
| 2015/0041454 A1 | 2/2015 | Foret | |
| 2015/0068113 A1 | 3/2015 | Conner et al. | |
| 2015/0074567 A1 | 3/2015 | Lan et al. | |
| 2015/0075429 A1* | 3/2015 | Park | C23C 16/45502 118/719 |
| 2015/0284534 A1* | 10/2015 | Thierry | B22F 1/0088 106/472 |
| 2015/0307360 A1 | 10/2015 | Bills et al. | |
| 2015/0361552 A1* | 12/2015 | Kostamo | C23C 16/4417 427/255.28 |
| 2016/0005897 A1* | 1/2016 | Honda | H01J 37/32798 136/256 |
| 2016/0027608 A1 | 1/2016 | Madocks | |
| 2016/0090535 A1 | 3/2016 | Abdullah et al. | |
| 2016/0141599 A1* | 5/2016 | Takahashi | H01M 4/366 429/231.8 |
| 2016/0215111 A1 | 7/2016 | Bilek et al. | |
| 2016/0227699 A1 | 8/2016 | Wolfe et al. | |
| 2016/0276134 A1 | 9/2016 | Collins et al. | |
| 2016/0322174 A1 | 11/2016 | Fan et al. | |
| 2016/0351404 A1 | 12/2016 | Aramaki et al. | |
| 2017/0189877 A1 | 7/2017 | Abdullah et al. | |
| 2017/0306489 A1* | 10/2017 | Miyazaki | H01J 37/32568 |

FOREIGN PATENT DOCUMENTS

| | | |
|---|---|---|
| CN | 203588971 U | 5/2014 |
| CN | 104519992 A | 4/2015 |
| EP | 2891729 A1 | 7/2015 |
| GB | 1497782 A | 1/1978 |
| JP | 02-253823 | 10/1990 |
| JP | 08-158999 | 7/1996 |
| JP | 2000-42494 | 2/2000 |
| WO | WO-2011/097183 A2 | 8/2011 |
| WO | WO-2014/031390 A3 | 2/2014 |
| WO | WO 2017/182570 A1 | 10/2017 |
| WO | WO-2017/209632 A1 | 12/2017 |
| WO | WO-2018/136502 A1 | 7/2018 |
| WO | WO-2018/175689 A1 | 9/2018 |
| WO | WO-2018/226966 A1 | 12/2018 |
| WO | WO-2020/014448 A1 | 1/2020 |

OTHER PUBLICATIONS

Dehkhoda, Am et al., "A novel method to tailor the porous structure of KOH-activated biochar and its application in capacitive deionization and energy storage", Biomass and Bioenergy, 2016.

Talukder, A-A, "Plasma treatment of zinc oxide thin film and temperature sensing using the zinc oxide thin film", <https://openprairie.sdstate.edu/cgi/viewcontent.cgi>? article=2048&context=etd 2016.

Foggiato, J., "Handbook of Thin-Film Deposition Processes and Techniques, Second Edition—Chaoter 3: Chemical Vapor Deposition of Silicon Dioxide Films," Noyes Publications, 2002, 54 pages.

Gabriel, O. et al., "Plasma monitoring and PECVD process control in thin film silicon-based solar cell manufactring," EPJ Photovoltaics 5, Feb. 5, 2014, 9 pages.

Henkel, C. et al., "Deposition of dielectrics and metal gate stacks (CVC, ALD), Lecture 8," KTH, published Spring 2013, 57 pages.

Menendez, A. et al., "Depositions of Thin Films: PECVD Process," Silicon Based Thin Film Solar-Cells, 2013, pp. 29-57.

Talukder, A. et al., "Improving electrical properties of sol-gel derived zinc oxide thin films by plasma treatment," Journal of Applied Physics 120, 155303, 2016, 24 pages.

Wang, K. et al., "Low-temperature plasma exfoliated n-doped graphene for symmetrical electrode supercapacitors," Nano Energy Journal vol. 31, Journal Issue C, Journal ID: ISSN 2211-2855, Jan. 1, 2017, 27 pages.

Summary of prior capacitively coupled and inductively coupled plasma sources—publicly used prior to January of 2017.

South Dakota State University, "Reducing cost of producing supercapacitors," www.sciencedaily.com, Aug. 18, 2016, 2 pages.

"SDSU Researchers Use Biochar to Develop Cost-Effective Supercapacitors," www.azom.com, Aug. 22, 2016, 3 pages.

South Dakota State University, "Transforming biochar into activated carbon," www.sciencedaily.com, Jan. 30, 2015, 2 pages.

Simpson, J., "Plasma Etching of Biochar Reduces Supercapacitor Costs," Engineering 360, Sep. 7, 2016, 1 page.

Zeng, A. et al., "Plasma Treated Active Carbon for Capacitive Deionization of Saline Water," Department of Electrical and Computer Engineering, et al., published prior to Jul. 18, 2019, 16 pages.

Neodymium Ring Magnet—RZ0Y0X0, www.kjmagnetics.com, offered for sale prior to Jul. 18, 2019, 6 pages.

Summary of prior capacitively coupled and magnetically enhanced RF plasma discharge systems—publicly used or disclosed prior to July of 2018.

"Plasma-enhanced chemical vapor deposition," www.wikipedia.com, Jul. 17, 2018, 3 pages.

* cited by examiner

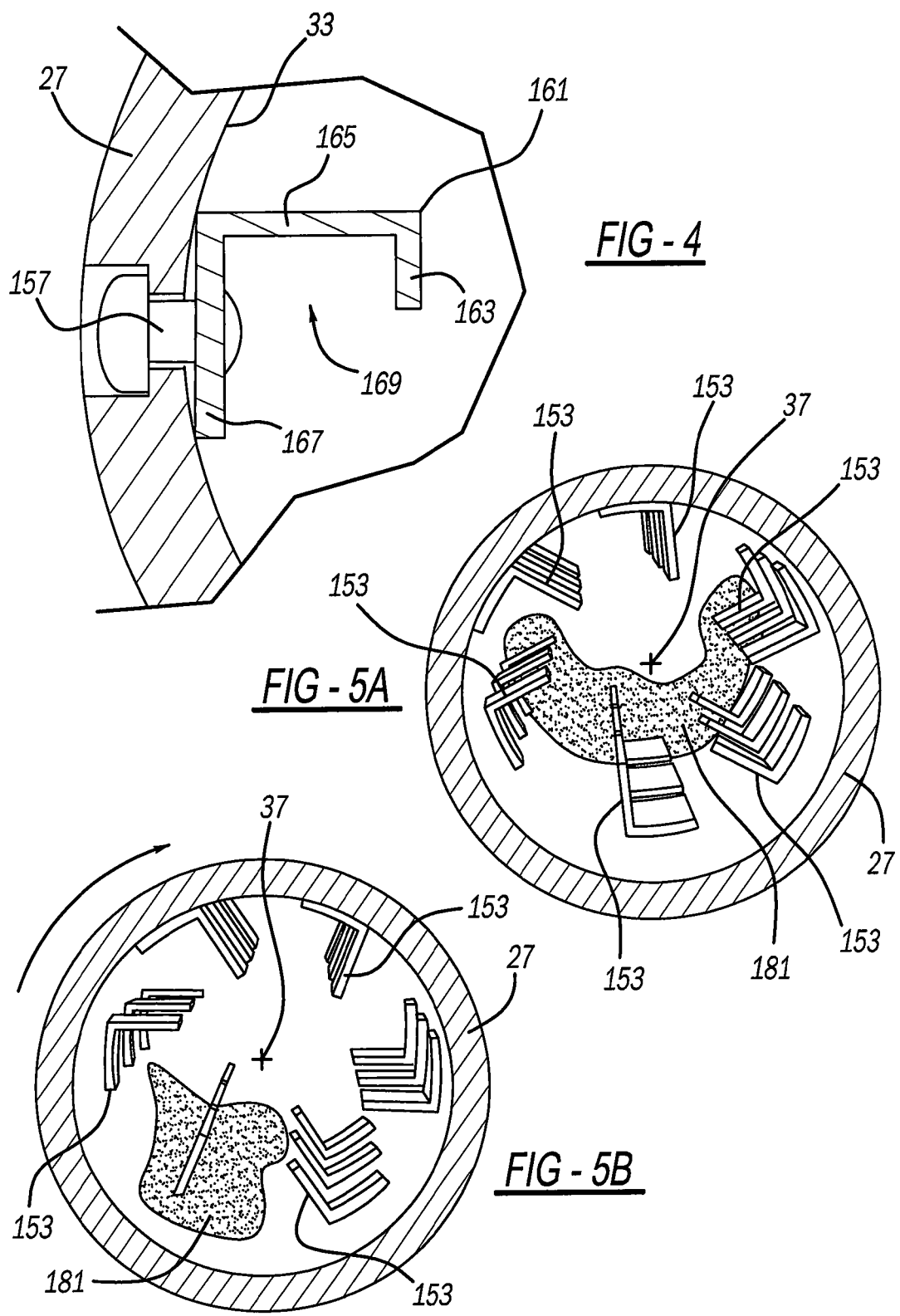

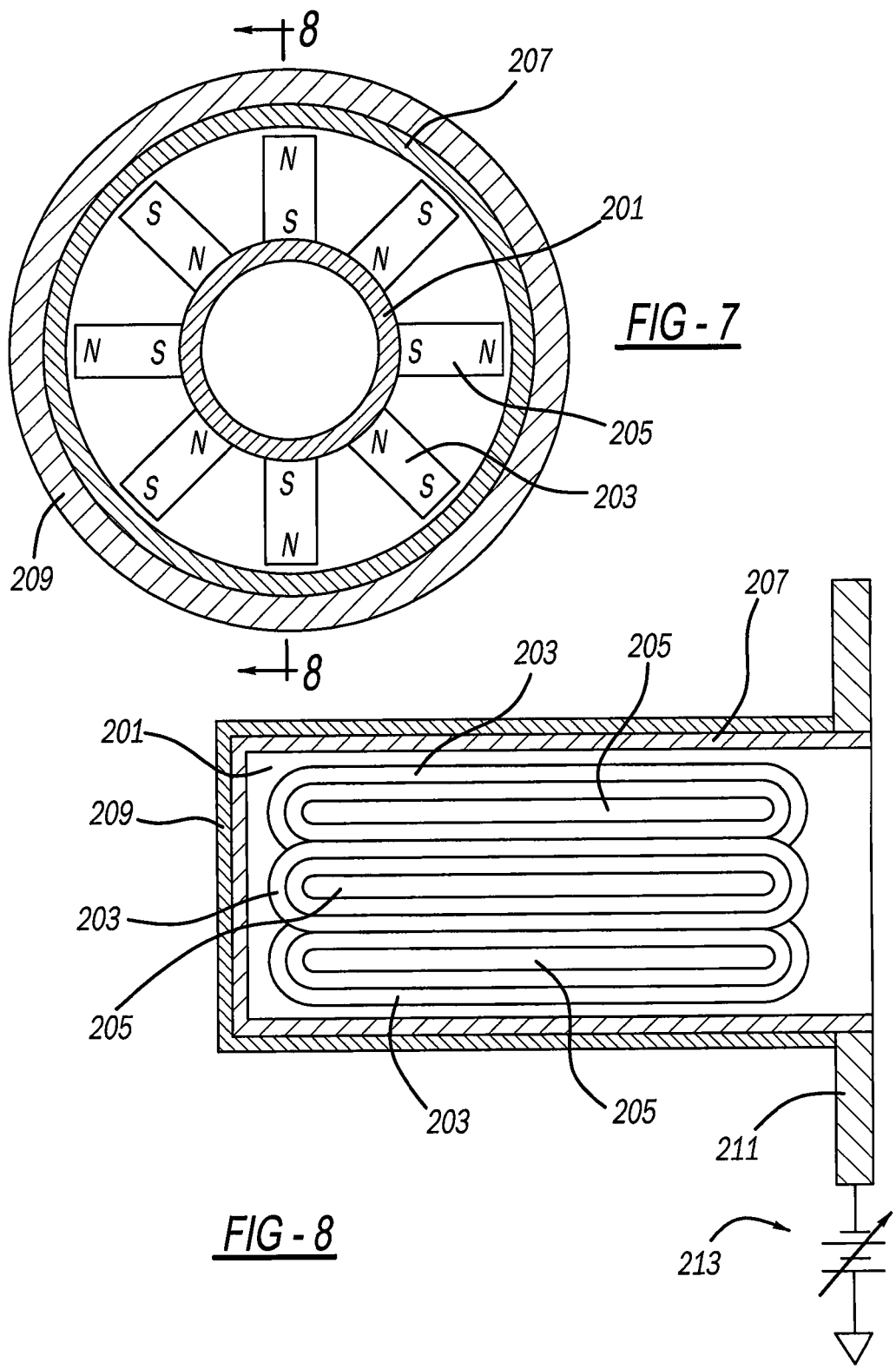

ROTARY PLASMA REACTOR

CROSS-REFERENCE

This application claims priority to U.S. Provisional Patent application No. 62/836,831, filed on Apr. 22, 2019, which is incorporated by reference herein.

GOVERNMENT SUPPORT CLAUSE

This invention was made with government support under 1700785, 1700787 and 1724941, awarded by the National Science Foundation. The government has certain rights in the invention.

BACKGROUND AND SUMMARY

This disclosure pertains generally to plasma reactors and more particularly to a rotary plasma reactor.

Plasma activation of biochar material was disclosed in U.S. Pat. No. 9,754,733 entitled "Method for Plasma Activation of Biochar Material," and international PCT Patent Publication No. WO 2018/136502 entitled "Magnetic Field Enhanced Plasma for Materials Processing" both to Q. Fan (one of the co-inventors of the present application). This patent and patent publication are incorporated by reference herein. While these are significant advances in the industry, further improvements are now desirable.

Conventional plasma systems employ a static machine within which particles are stationarily retained in a sample holder throughout the plasma treatment process. If the particles pile up, the plasma species disadvantageously interacts primarily with only an exposed top layer and much less so with hidden middle and bottom layers and surfaces. Thus, static plasma systems have room for improvement when used in mass production where a high volume of particles are processed.

In accordance with the present invention, a rotary plasma reactor system is provided. In another aspect, a plasma reactor is rotatable about a generally horizontal axis within a vacuum chamber. A further aspect employs a plasma reactor, a vacuum chamber, and an elongated electrode internally extending within a central area of the reactor. Yet another aspect employs a plasma reactor for use in activating, etching and/or coating tumbling workpiece material such as workpiece powder particles.

A further aspect uses spaced apart structures which internally project within a plasma reactor to move workpiece material from an inlet to an outlet in a generally horizontal direction. Another aspect includes a rotating reactor with a central internal electrode to transport workpiece material, tumble the workpiece material, plasma react the workpiece material, and optionally, sputter coat the workpiece material. A method of transporting, tumbling and/or acting upon material moving in a primarily horizontal direction, is additionally disclosed.

The present reactor is advantageous over prior devices. For example, the present reactor can more efficiently process a higher quantity of particles or material in a faster and more uniform manner than can conventional static workpiece devices. Furthermore, the rotary nature of the present plasma reactor, especially when combined with internally projecting fin structures and a centrally disposed electrode, provide plasma activation and/or sputter coating access to essentially all external surfaces of all workpiece powder particles as they are tumbled and/or transported. This allows for full coating of each particle which is especially beneficial for coating pharmaceutical drugs and coating metal particles, among other uses. Additional advantages and features will be disclosed in the following description and appended claims as well as in the accompanying drawings.

BRIEF DESCRIPTION OF THE DRAWINGS

FIG. 4 is a fragmentary and cross-sectional view, taken along line 3-3 of FIG. 1, showing a second embodiment plasma reactor system;

FIGS. 5A-C are a series of diagrammatic cross-sectional views, taken along line 5-5 of FIG. 1, showing the first embodiment plasma reactor system when rotating;

FIG. 7 is a cross-sectional view, like that of FIG. 2, showing a central electrode assembly employed in the third embodiment plasma reactor system;

FIG. 8 is a longitudinal-sectional view, taken along line 8-8 of FIG. 7, showing the central electrode assembly employed in the third embodiment plasma reactor system;

DETAILED DESCRIPTION

Figure 1:
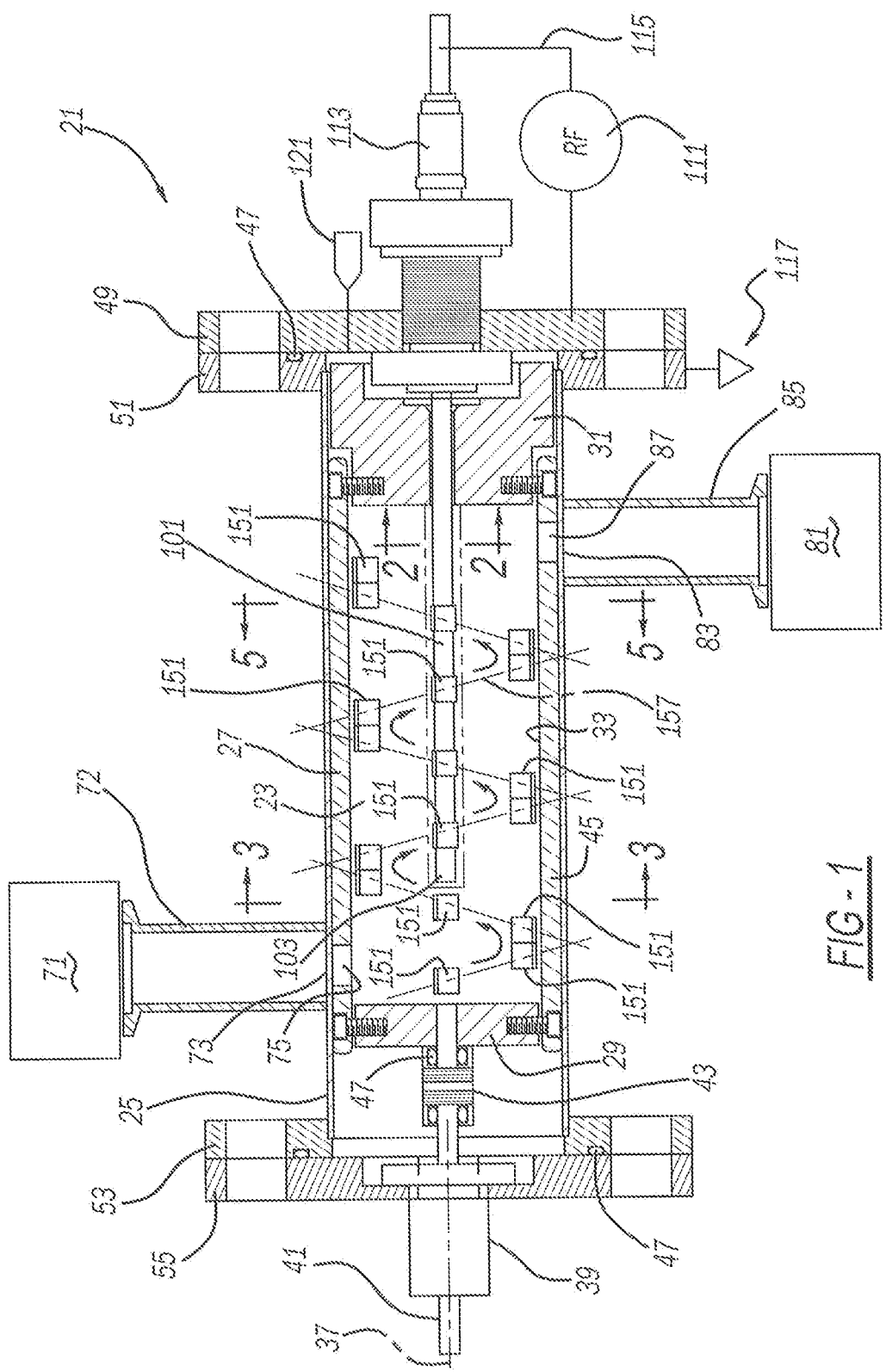
FIG. 1 is a longitudinal-sectional view showing a first embodiment of the present plasma reactor system.
Figure 2:
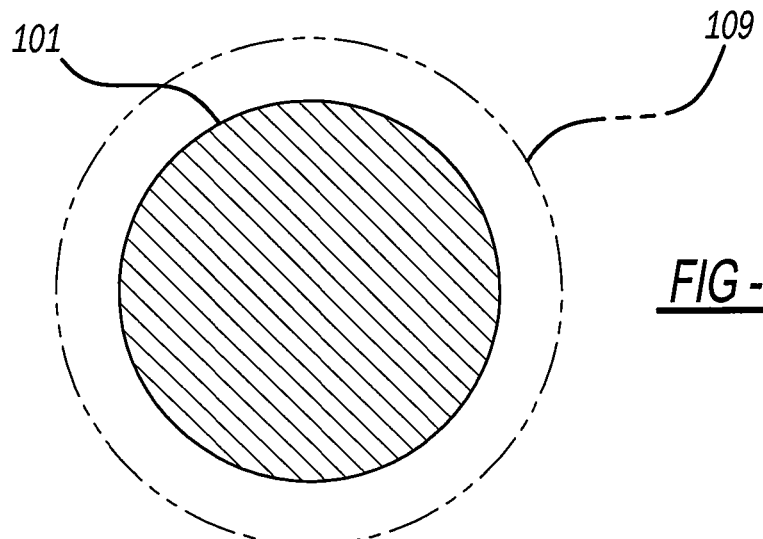
FIG. 2 is a cross-sectional view, taken along line 2-2 of FIG. 1, showing a central electrode employed in the first embodiment plasma reactor system.
Figure 3:
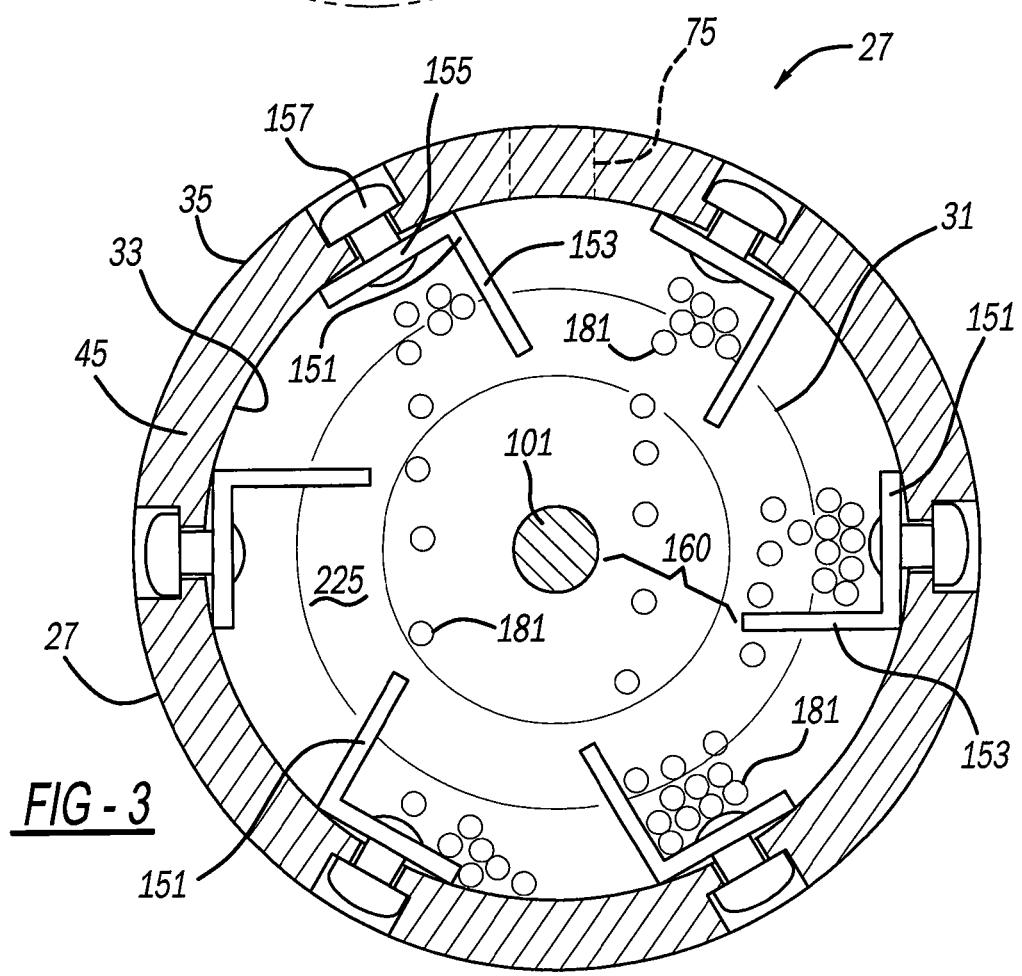
FIG. 3 is a cross-sectional view, taken along line 3-3 of FIG. 1, showing a plasma reactor employed in the first embodiment plasma reactor system.
Figure 5C:
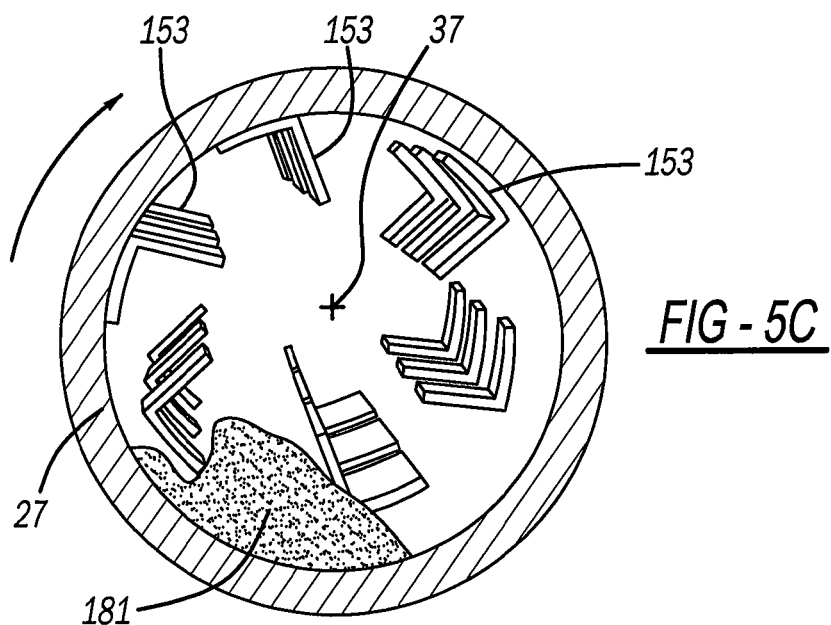

A first embodiment of a plasma reactor system 21 is illustrated in FIGS. 1-3. This reactor system includes a vacuum cavity 23 within a generally horizontally and longitudinally elongated vacuum chamber 25. A plasma reactor 27 is concentrically located within vacuum chamber 25. An end plate 29 and optional insulator cap 31 are fastened inside opposite longitudinal ends of plasma reactor 27. Plasma reactor 27 preferably has a casing 45 defined by longitudinally elongated circular-cylindrical inside and outside surfaces, 33 and 35, respectfully, which is rotated about a generally horizontal axis 37 by an electric motor actuator 39. Furthermore, a rotatable shaft 41 and a transmission coupler 43 couple end plate 29 and/or outer casing 45 of plasma reactor 27 to actuator 39. O-ring seals 47 or the like seal vacuum cavity 23 between vacuum flanges 49, 51, 53 and 55 adjacent the ends of the plasma reactor.

A feeder tank or hopper 71 is connected via a tube 72 to an inlet 73 in an upper portion of vacuum chamber 25, which is aligned with one or more circumferentially spaced inlet apertures 75 through casing 45 of plasma reactor 27. Inlet apertures 75 are adjacent a first end of the reactor. A collector tank or hopper 81 is connected to an outlet 83 of vacuum chamber 25, via a tube 85. Outlet 83 aligns with one or more outlet apertures 87 in a bottom of casing 45 of plasma reactor 27, adjacent a second end of the reactor generally diagonally opposite inlet aperture 75.

Moreover, a longitudinally elongated electrode 101 centrally extends from vacuum flange 49, through central holes in flange 51 and insulator cap 31, and internally within plasma reactor 27. Central electrode 101 is a solid conductive metal, preferably copper or an alloy thereof. Central electrode 101 is at least five times, and more preferably at least ten times, longitudinally longer than its diameter within the vacuum cavity portion of the plasma reactor. A distal end 103 of central electrode 101 is preferably spaced away from end plate 29 so as not to obstruct workpiece material falling down from inlet aperture 75 and the central electrode is entirely spaced away from inside surface 33. Notwithstanding, the central electrode longitudinally extends more than a majority of the open longitudinal distance within the plasma reactor which advantageously provides a plasma field along most of the interior area of the reactor. Thus, this central electrode construction is expected to more uniformly create a plasma reaction throughout the length of the plasma reactor, be exposed to more of the workpiece material and for a longer time.

Optionally, a quartz cylinder 109 encapsulates or covers central electrode 101 within the open vacuum space. Quartz cylinder 109 can be affixed to insulator cap 31 and thereby rotated about axis 37 along with plasma reactor 27. Thus, quartz cylinder 109 is rotated about the otherwise stationary central electrode 101 to aid in dumping any of the workpiece material falling thereon.

A radio frequency ("RE") power source 111 is electrically connected to a proximal connector 113 of central electrode 101 by way of an electrical circuit 115. A grounding electrical circuit 117 is connected to vacuum flange 51, which is in electrical contact with metallic vacuum chamber 25 to serve as a surrounding anode electrode. A matching network is electrically connected between central electrode 101 and RF power source 111 and includes variable capacitors and/or inductor electronics that can be tuned to match plasma impedance with that of the RF power source.

A gas supply cylinder or tank 121 is coupled to an end of vacuum chamber 25 at a port and a vacuum pump is also coupled to a port through the vacuum chamber. A reactive gas or mixture of reactive gases flows from gas tank 121 into the vacuum chamber at a vacuum pressure lower than nominal ambient atmospheric pressure at sea level. Examples of such reactive gases include oxygen, hydrogen, nitrogen, methane, steam water, anhydrous ammonia, or other gases including inert gases, or mixtures thereof, optionally including carbon, argon, silane or metalorganic gases. Oxygen is preferably used for some applications, like with biochar activation, while hydrogen is preferred for other uses such as PFAS removal. It is noteworthy that low gas pressures are employed, preferably one hundred milliTorr to two thousand milliTorr, by way of non-limiting example.

Multiple structures 151 each include a fin 153, which inwardly projects in a radial direction generally toward horizontal axis 37. Each structure 151 also includes an angularly offset base 155, which is fastened against inner surface 33 of the plasma reactor's casing 45 by a rivet 157, weld or other fastener. Many of structures 151 are longitudinally and circumferentially spaced from each other to create a generally spiraling pattern 157. A radial gap 160 is between an innermost end of each fin 153 and an outside surface of central electrode 101. This allows the workpiece material to freely fall therebetween with minimal or no obstruction.

An alternate embodiment of structures 161 is shown in FIG. 4 and each includes a distal lip 163 turned back from a radially projecting fin 165 which extends from a base 167 to define a generally U-shaped bucket 169 therein. Other structure shapes can also be used, such as a T-shape by way of a nonlimiting example, or making each longitudinally elongated in a straight or twisted fashion to extend a majority length of reactor 27.

Figure 6:
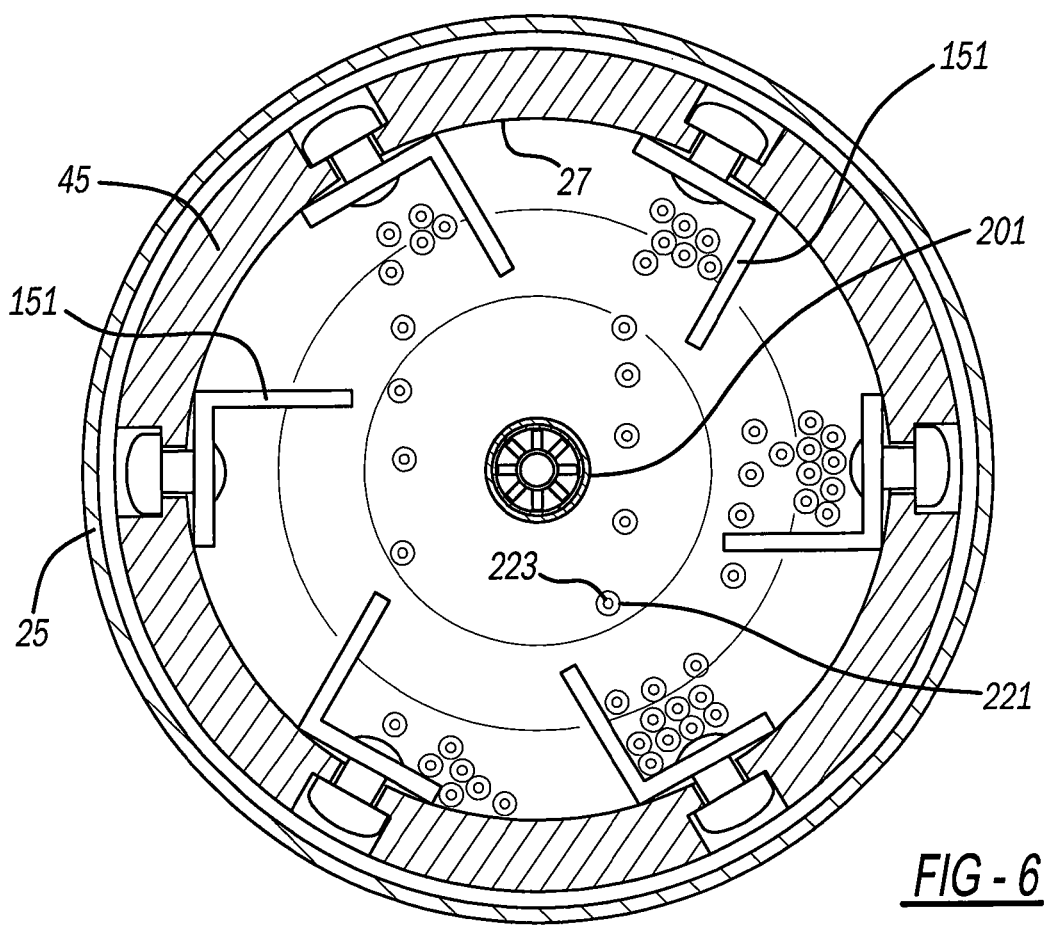
FIG. 6 is a cross-sectional view, like that of FIG. 3, showing a third embodiment of the present plasma reactor system.

Reference should now be made to FIGS. 1, 3 and 5A-C to observe the function of the present plasma reactor system 21. Workpiece material is preferably powder particles 181 such as granular activated carbon and biochar. Powder particles 181 are automatically and continuously gravity fed from hopper 71 and into top inlet apertures 75 of the rotating plasma reactor 27. Fins 153 of structures 151 rotate about axis 37 with plasma reactor 27 and lift the adjacent powder particles and then dump them due to gravity when the fins exceed 90° from the bottom position, as is best illustrated in FIG. 6. This creates a tumbling action while also separating and rotating each powder particle 181 as it falls through the open vacuum space. Therefore, this allows complete exterior surface exposure of each powder particle 181 to the plasma and electromagnetic field on at least one occasion within the reactor. Furthermore, the spiral arrangement of fins 153 longitudinally transports and moves the powder particles from the inlet end of reactor 27 to the outlet end of the reactor, as can be observed by comparing FIGS. 5A-C. Accordingly, the fin structures beneficially serve in a multifunctional role. Plasma is generated between the electrodes by the RF electrical field acting upon the reactive gas using an excitation power of at least 50 watts, with a radio frequency of preferably 13.56 MHz.

Another embodiment of the present plasma reactor system 21 is illustrated in FIGS. 6-9. The system is the same as in the prior embodiments except for a different central electrode assembly. The present exemplary central electrode assembly includes a hollow and longitudinally elongated central electrode 201, made of a conductive metallic tube, optionally with liquid cooling paths therein. Radially oriented North-South permanent magnets 203 alternate with radially oriented South-North permanent magnets 205. Magnets 203 and 205 are fastened to and directly contact against central holder 201. Moreover, magnets 203 have a closed loop and oval shape, with straight middle sections elongated in the longitudinal direction generally parallel with horizontal axis 37 (see FIG. 1). The middle sections of magnets 203 overlap each other in its preferred exemplary construction. Magnets 205 are straight and located within the open area inside each looped magnet 203 in a spaced apart manner.

In one option, the central electrode assembly may also include an outer metallic cylindrical sheath 207 attached thereto, which surrounds magnets 203 and 205. Moreover, a magnetron sputter target 209 has a cylindrical shape. Sputter target 209 surrounds and is attached to sheath 207, which is welded to a flange 211. A direct current ("DC") or RF power source 213 is electrical connected to flange 211.

Figure 9:
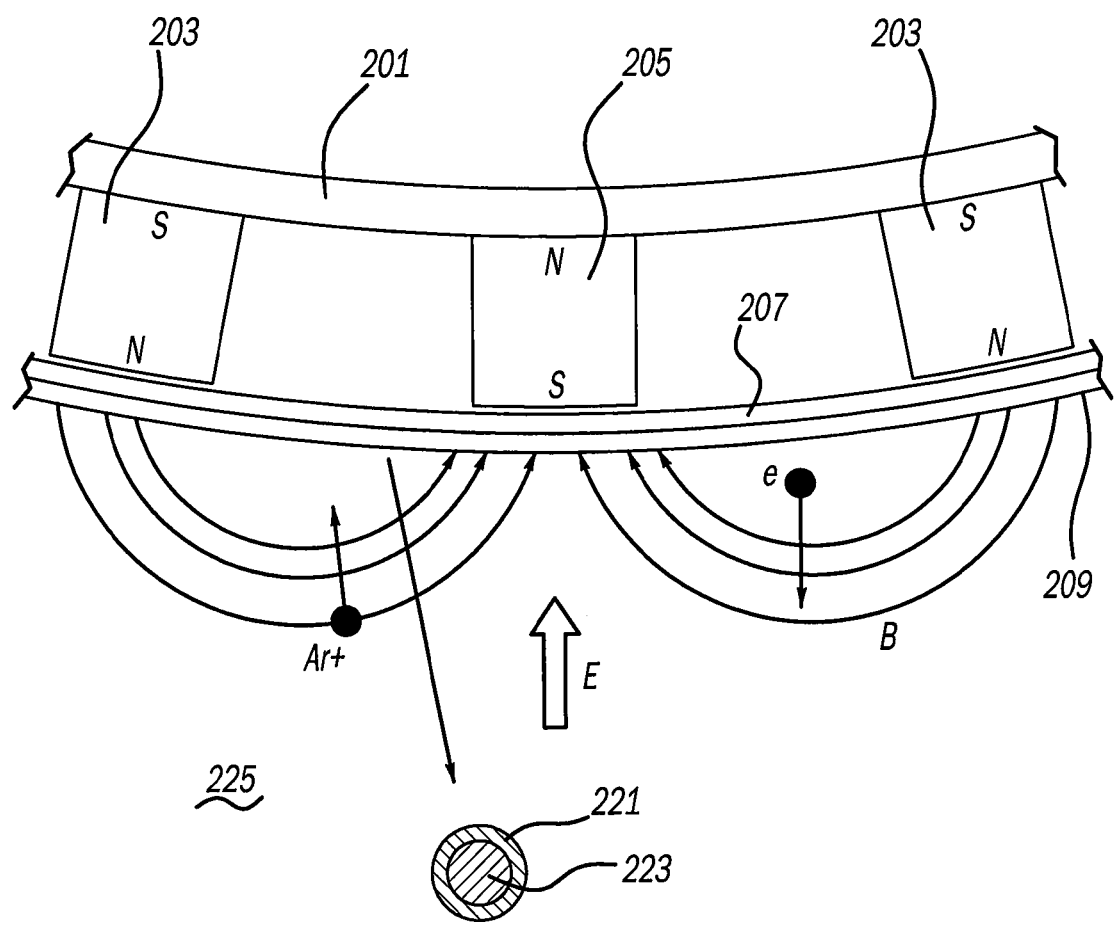
FIG. 9 is a fragmentary and diagrammatic view showing the central electrode assembly employed in the third embodiment plasma reactor system.

As best observed in FIG. 9, preferably a primary or majority direction of an electrical field vector E generated between anode (vacuum chamber) electrode 25 (see FIG. 1) and cathode electrode 201, is oriented in a direction generally perpendicular to horizontal axis 37. A magnetic induction field vector B flows from one magnet 203 to the other 205, a majority middle segment of which is generally parallel with horizontal axis 37, albeit in a slightly curved or arcuate path therebetween. In this embodiment, the majority middle segment of magnetic field vector B primarily flows in a direction generally perpendicular to a primary majority direction of electrical field vector E, and certainly in an offset angular direction therefrom.

The present magnetic field beneficially confines high energy electrons $e^-$ from escaping to vacuum cavity electrode 25. With this magnetic field enhanced plasma process and equipment, the plasma density is advantageously increased at least six times greater than without use of magnetic fields. Furthermore, the magnetic field strength with permanent magnets 203 and 205 is preferably 50-4,000 Gauss, and more preferably 100-2,000 Gauss, and even more preferably 200-2,000 Gauss. The present magnetically densified plasma beneficially provides a coating 221 onto powder particles or materials 223. Plasma 225 creates highly reactive species, such as ions, which directly contact against the workpiece material 223 for coating, etching, surface treatment and/or activation thereof. This is especially advantageous for adding a slow-release digestion coating to a pharmaceutical active ingredient particle, an anti-oxidant coating on a metallic particle for an automotive vehicle airbag propellant, or the like.

Figure 10:
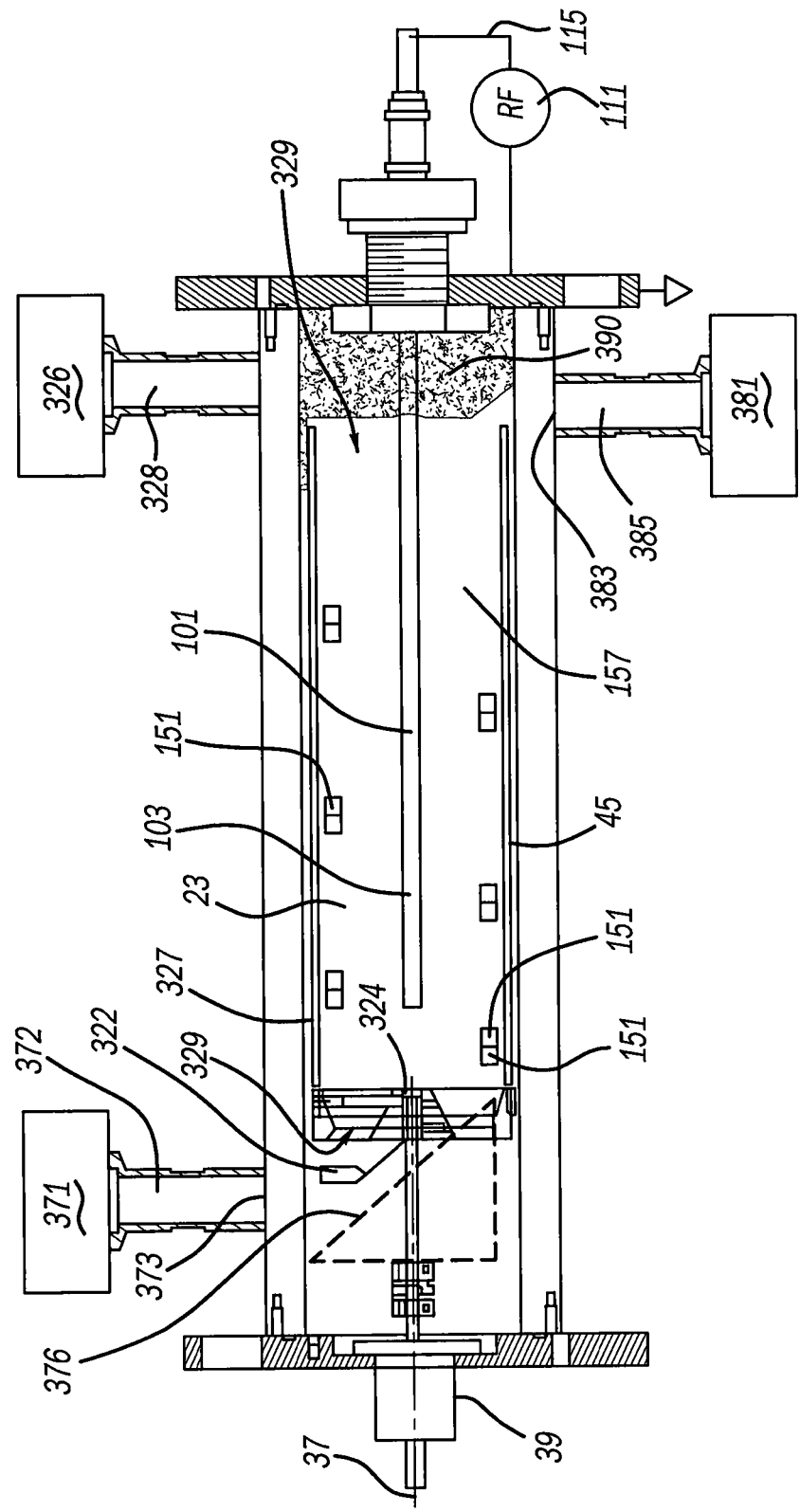
FIG. 10 is a longitudinal-sectional view showing a fourth embodiment of the present plasma reactor system.

A fourth embodiment of a plasma reactor system is illustrated in FIG. 10. This reactor system is similar to the first embodiment and includes a vacuum cavity 23 within a generally horizontally and longitudinally elongated vacuum chamber. A plasma reactor 327 is concentrically located within the vacuum chamber and has open ends 329. Plasma reactor 327 has longitudinally elongated circular-cylindrical inside and outside surfaces which are rotated about a generally horizontal axis 37 by an electric motor actuator 39.

A differently located feeder tank or hopper 371 is connected via a tube 372 to an inlet 373 in an upper portion of the vacuum chamber. A diagonal chute or feeding ramp 376 transfers the incoming powder material from feed tube 372 to leading open end 329 of reactor 327. A collector tank or hopper 381 is connected to an outlet 383 of the vacuum chamber, via a tube 385. Outlet 383 receives the processed material falling from a bottom of trailing end 329 of plasma reactor 27, generally diagonally opposite inlet 373.

Moreover, a longitudinally elongated electrode 101 centrally extends through a central hole in the end flange, and internally within plasma reactor 327. RF power source 111 is connected proximal connector 113 of central electrode 101 via electrical circuit 115. A gas supply cylinder or tank 322 is connected to a central conduit 324 adjacent centerline axis 37. Furthermore, a vacuum pump and outlet assembly 326 are connected to vacuum chamber 25 by a tube 328. A ceramic insulator 390 is stationarily located adjacent an end of the reactor to assist in containing the plasma field. The insulator includes an upper flange projecting between reactor 327 and the vacuum chamber, while a tapered lower corner allows egress of the workpiece material to outlet 383.

The present rotary reactor embodiments are ideally suited to activate and/or treat carbon workpiece material, such as coal, biochar, and other processed carbons, and other powders via plasma, thermal and/or chemical processes. Moreover, the rotary reactor may be a heterogeneous gas-solid type of reactor. Such a system advantageously provides multiple workpiece material passes through the plasma as it is tumbled, thereby improving activation or treatment quality. Alternately, the fin structure may be part of one or more continuously longitudinally extending full or partial spirals having a three-dimensionally continuous curved shape, inwardly extending from the rotating chamber.

While various embodiments have been disclosed, other variations are possible. For example, the permanent magnets may be replaced by helical coils of wires, thereby creating inductive coil magnets, or the reactor may be operated without any magnets or coils, although specific benefits may not be operated without any magnets or coils, although specific benefits may not be achieved. Moreover, horizontal axis 37 may have a slight tilt of up to +/− 1° from horizontal such that gravity can assist or slow down longitudinal transport of the workpiece material through the reactor. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. It is alternately envisioned that the dependent claims are all multiply dependent on each other in some aspects of the present application. The same may also be varied in many ways. Such variations are not to be regarded as a departure from the disclosure, and all such modifications are intended to be included within the scope and spirit of the present invention.

The invention claimed is:

1. A plasma reactor system comprising:
a vacuum chamber;
a plasma reactor located inside the vacuum chamber;
the plasma reactor being rotatable about a substantially horizontal and longitudinal axis;
a workpiece material feed inlet located adjacent a first end of the plasma reactor;
a workpiece material feed outlet located adjacent a second end of the plasma reactor, the inlet and the outlet being longitudinally spaced away from each other;
the plasma reactor including internally projecting structures configured to tumble workpiece material and transport the workpiece material in a longitudinal direction between the inlet and the outlet;
the structures including a portion inwardly projecting from a curved inner surface of the plasma reactor in a radial direction substantially toward the horizontal and longitudinal axis, and a geometric line intersecting the internally projecting structures having a substantially spiral shape;
a central electrode located inside the plasma reactor along the longitudinal axis;
at least a majority of the internally projecting structures being longitudinally and radially adjacent to the central electrode internally located therein, and the electrode being stationary while the projecting structures rotate about the longitudinal axis of the plasma reactor;
a radio frequency power source electrically connected to a proximal end of the central electrode adjacent to an electrically grounded vacuum flange which is electrically connected with the vacuum chamber; and
the vacuum chamber being metallic and serving as a surrounding anode electrode.

2. The plasma reactor system of claim 1, wherein the central electrode is at least five times longitudinally longer than its diameter within the vacuum chamber, the central electrode including a solid conductive metal rod.

3. The plasma reactor system of claim 1, further comprising:
a distal end of the central electrode spaced away from an end plate of the vacuum chamber which is adjacent the feed inlet.

4. The plasma reactor system of claim 1, further comprising magnets fastened to the central electrode, which is hollow, with North-South of the magnets alternating with South-North of the magnets, and each of the magnets including a longitudinally elongated middle section substantially parallel to the longitudinal axis of the plasma reactor.

5. The plasma reactor system of claim 1, further comprising:

the plasma reactor being horizontally elongated between the ends;
a reactive gas inlet coupled to the plasma reactor;
the central electrode creating a plasma in the plasma reactor with the reactive gas;
the reactive gas inlet being spaced away from the central electrode and the surrounding anode electrode; and
the workpiece material including carbon or powder which is horizontally moved from the workpiece material inlet to the outlet while being tumbled within the plasma.

6. The plasma reactor system of claim 5, wherein the workpiece material includes a pharmaceutical powder.

7. The plasma reactor system of claim 5, wherein the workpiece material includes biochar.

8. The plasma reactor system of claim 5, wherein the workpiece material includes fossil carbon.

9. The plasma reactor system of claim 1, wherein the structures include spaced apart fins radially projecting inwardly from a cylindrical inside surface of the plasma reactor, the fins being circumferentially and longitudinally spaced apart from each other.

10. The plasma reactor system of claim 1, wherein the internally projecting structures each include perpendicular walls.

11. The plasma reactor system of claim 1, further comprising:
the central electrode located within the plasma reactor; and
a sputter target located within the plasma reactor.

12. The plasma reactor system of claim 1, further comprising an electrical field vector direction, between the vacuum chamber and the central electrode, being oriented substantially perpendicular to the horizontal axis, and a magnetic field strength is 100-2,000 Gauss.

13. A plasma reactor system comprising:
a vacuum pump;
a vacuum chamber coupled to the vacuum pump;
a plasma reactor located within the vacuum chamber;
the plasma reactor being rotatable about a substantially horizontal axis;
a material inlet located adjacent a first end of the plasma reactor;
a material outlet located adjacent an opposite second end of the plasma reactor;
a reactive gas inlet coupled to the plasma reactor;
electrodes being configured to create a plasma in the plasma reactor with the reactive gas;
the reactive gas inlet being spaced away from the electrodes;
carbon or powder being horizontally movable from the material inlet to the material outlet while being tumbled within the plasma reactor;
one of the electrodes being a central electrode located inside the plasma reactor along the substantially horizontal axis;
the central electrode being at least five times longitudinally longer than its diameter within the vacuum chamber;
an electrically grounded flange; and
a radio frequency power source electrically connected to the central electrode which is adjacent to the electrically grounded flange, the flange being electrically connected with the vacuum chamber to serve as a surrounding anode electrode.

14. The plasma reactor system of claim 13, wherein the central electrode includes a solid conductive metal rod.

15. The plasma reactor system of claim 13, further comprising:
a distal end of the central electrode being spaced away from the first end of the vacuum chamber which is adjacent the material inlet.

16. The plasma reactor system of claim 13, further comprising magnets fastened to the central electrode, which is hollow, with North-South of the magnets alternating with South-North of the magnets, and each of the magnets including a longitudinally elongated middle section substantially parallel to the substantially horizontal axis of the plasma reactor.

17. The plasma reactor system of claim 13, further comprising:
at least one internally projecting structure located adjacent to at least one of the electrodes;
the structure being rotatable to tumble the carbon or powder through the plasma; and
a geometric line, intersecting innermost points along the at least one internally projecting structure, having a substantially spiral shape.

18. A plasma reactor system comprising:
a vacuum chamber serving as a surrounding electrode;
a plasma reactor, located inside the vacuum chamber, rotatable about a substantially horizontal axis;
a central electrode located inside the plasma reactor;
the central electrode being at least five times longer than its diameter within the plasma reactor;
a radio frequency power source connected to the central electrode;
at least one internally projecting fin rotating with the plasma reactor around the central electrode which is stationary; and
a geometric line, intersecting innermost points along the at least one internally projecting fin, having a substantially spiral shape;
a workpiece material outlet aperture;
a workpiece material inlet aperture being located adjacent an opposite longitudinal end of the plasma reactor from the outlet aperture;
an electrically grounded flange located adjacent a proximal end of the central electrode and adjacent the workpiece material outlet aperture;
the radio frequency power source being electrically connected to the central electrode;
the flange being electrically connected with the vacuum chamber to serve as a surrounding anode electrode; and
the at least one fin being configured to horizontally move the workpiece material from the workpiece material inlet aperture to the workpiece material outlet aperture while the plasma reactor is rotating.

19. The plasma reactor system of claim 18 further comprising magnets fastened to the central electrode, which is hollow, with North-South of the magnets alternating with South-North of the magnets, and each of the magnets including a longitudinally elongated middle section substantially parallel to the axis of the plasma reactor.

20. The plasma reactor system of claim 18, wherein the fin includes multiple longitudinally spaced apart fins.

21. The plasma reactor system of claim 18, further comprising:
the plasma reactor being horizontally elongated between the ends;
a reactive gas inlet coupled to the plasma reactor at a location offset from the central electrode; and carbon or powder being horizontally movable from the material inlet to the material outlet while being tumbled within the plasma reactor.

22. The plasma reactor system of claim 18, wherein the at least one internally projecting fin includes multiple longitudinally and radially spaced apart fins, and has the substantially spiral shape.

23. The plasma reactor system of claim 18, wherein the fin has an L-shape.

24. The plasma reactor system of claim 18, wherein the fin has a U-shape.

25. The plasma reactor system of claim 18, wherein the at least one internally projecting fin includes multiple longitudinally and circumferentially spaced apart fins located between the workpiece material inlet aperture and the workpiece material outlet aperture.

26. The plasma reactor system of claim 18, further comprising an electrical field vector direction, between the vacuum chamber and the central electrode, being oriented substantially perpendicular to the horizontal axis, and a magnetic field strength is 100-2,000 Gauss.

27. A plasma reactor system comprising:
   an elongated plasma reactor rotatable about a substantially horizontal axis;
   a reactive gas operably located in the plasma reactor;
   a central electrode located inside the plasma reactor, the central electrode being at least five times longer than its lateral width;
   a radio frequency circuit connected to the central electrode;
   an electrically grounded flange electrically connected with a stationary metallic vacuum chamber to serve as an anode electrode surrounding the plasma reactor, a proximal end of the central electrode being located adjacent to the flange;
   multiple longitudinally spaced apart and internally projecting fins rotating with the plasma reactor around the central electrode which is stationary; and
   workpieces being activated, treated, etched or coated within the plasma reactor.

28. The plasma reactor system of claim 27, further comprising:
   a material inlet located adjacent a first end of the plasma reactor;
   a material outlet located adjacent an opposite second end of the plasma reactor; and
   the workpieces being horizontally movable from the material inlet to the material outlet while being tumbled within the plasma reactor.

29. The plasma reactor system of claim 27, wherein a geometric line intersecting the internally projecting structures has a substantially spiral shape.

30. The plasma reactor system of claim 27, further comprising:
   a gas inlet spaced away from the central electrode and allowing the gas to flow into the plasma reactor during tumbling and horizontal movement of the workpieces therein; and
   the central electrode comprising a solid metal rod.

31. The plasma reactor system of claim 27 further comprising magnets fastened to the central electrode, which is hollow, with North-South of the magnets alternating with South-North of the magnets, and each of the magnets including a longitudinally elongated middle section substantially parallel to the axis of the plasma reactor.

* * * * *